US012791649B2

(12) United States Patent
Liu et al.

(10) Patent No.: US 12,791,649 B2
(45) Date of Patent: Nov. 10, 2026

(54) METHOD OF SELF-CALIBRATION CURRENT SENSOR

(71) Applicant: HONEYWELL INTERNATIONAL INC., Charlotte, NC (US)

(72) Inventors: Zhi Liu, Charlotte, NC (US); Wu Chen, Charlotte, NC (US); Ting Song, Charlotte, NC (US); Liansheng Han, Charlotte, NC (US); Jinxi Gu, Charlotte, NC (US); Jun Sun, Charlotte, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 202 days.

(21) Appl. No.: 18/640,788

(22) Filed: Apr. 19, 2024

(65) Prior Publication Data

US 2024/0369666 A1 Nov. 7, 2024

(30) Foreign Application Priority Data

May 5, 2023 (CN) ......................... 202310495339.2

(51) Int. Cl.
*G01R 35/00* (2006.01)
*G01R 15/18* (2006.01)
(Continued)

(52) U.S. Cl.
CPC ......... *G01R 35/005* (2013.01); *G01R 15/185* (2013.01); *G01R 15/20* (2013.01); *G01R 19/2506* (2013.01)

(58) Field of Classification Search
CPC .. G01R 15/182; G01R 35/005; G01R 15/185; G01R 15/20; G01R 19/2506;
(Continued)

(56) References Cited

U.S. PATENT DOCUMENTS 7,321,226 B2 1/2008 Yakymyshyn et al.
8,125,239 B2 2/2012 Rittmann
(Continued)

FOREIGN PATENT DOCUMENTS

CN 103852619 A 6/2014
CN 106707015 A 5/2017
(Continued)

OTHER PUBLICATIONS

English Translation of JP Notice of Allowance, including Search Report dated Jul. 1, 2025 for JP Application No. 2024067170, 3 page(s).

(Continued)

*Primary Examiner* — Alesa Allgood
(74) *Attorney, Agent, or Firm* — Alston & Bird LLP

(57) ABSTRACT

A self-calibrating current measuring apparatus comprising a low-range current sensor configured to generate first voltage signals, a high-range current sensor configured to generate second voltage signals, and a self-calibration current measuring circuit configured to: receive the first voltage signals and the second voltage signals, convert the first voltage signals and the second voltage signals into respective first digital signals and second digital signals, compare the first digital signals with the second digital signals, determine a difference between the first digital signals and the second digital signals exceed a recalibration threshold based on the comparison, generate calibration data based on the determination, and generate a digital output signal representative of a current reading based on an application of the calibration data to the second digital signals.

2 Claims, 8 Drawing Sheets

(51) Int. Cl.
*G01R 15/20* (2006.01)
*G01R 19/25* (2006.01)

(58) Field of Classification Search
CPC .. G01R 15/09; G01R 15/202; G01R 19/0092; G01R 19/25; G01R 15/183; G01R 35/007; G01R 19/10; G01R 19/16576
See application file for complete search history.

(56) References Cited

U.S. PATENT DOCUMENTS

| | | | | |
|---|---|---|---|---|
| 2010/0102910 A1* | 4/2010 | Waeckerle | C22C 38/08 | 335/297 |
| 2015/0042325 A1* | 2/2015 | Snoeij | G01R 15/185 | 324/251 |
| 2018/0372810 A1 | 12/2018 | Jiang et al. | | |
| 2021/0165066 A1 | 6/2021 | Aljadeff et al. | | |

FOREIGN PATENT DOCUMENTS

| | | | | |
|---|---|---|---|---|
| CN | 213517523 * | 11/2020 | G01R 15/20 | |
| CN | 213517523 U | 6/2021 | | |
| CN | 114675064 A | 6/2022 | | |
| WO | WO-2012070337 A1 * | 5/2012 | G01R 15/205 | |

OTHER PUBLICATIONS

English Translation of JP Office Action dated Feb. 4, 2025 for JP Application No. 2024067170, 4 page(s).
English translation of KR Notice of Allowance dated Jul. 8, 2025 for KR Application No. 10-2024-0053190, 7 page(s).
English Translation of KR Office Action dated Apr. 16, 2025 for KR Application No. 10-2024-0053190, 4 page(s).
JP Notice of Allowance, including Search Report Mailed on Jul. 1, 2025 for JP Application No. 2024067170, 3 page(s).
JP Office Action Mailed on Feb. 4, 2025 for JP Application No. 2024067170, 3 page(s).
KR Notice of Allowance Mailed on Jul. 8, 2025 for KR Application No. 10-2024-0053190, 7 page(s).
KR Office Action Mailed on Apr. 16, 2025 for KR Application No. 10-2024-0053190, 4 page(s).
Extended European Search Report Mailed on Sep. 6, 2024 for EP Application No. 24169546, 11 page(s).

* cited by examiner

METHOD OF SELF-CALIBRATION CURRENT SENSOR

CROSS-REFERENCE TO RELATED APPLICATIONS

This application claims priority pursuant to 35 U.S.C. 119(a) to Chinese Application No. 202310495339.2, filed May 5, 2023, which application is incorporated herein by reference in its entirety.

FIELD OF THE INVENTION

Example embodiments of the present disclosure relate generally to current sensors, and in particular, current sensor apparatuses and methods for self-calibrating thereof.

BACKGROUND

Current sensors are employed in many industrial and automotive applications, such as battery management systems. In order to obtain detailed information about state of health and state of charge of battery, integrating accurate sensors into a battery monitoring system is critical. Current sensors may be employed to measure the current flowing into (when charging) and out of (when discharging) the battery. Applicant has identified many technical challenges and difficulties associated with conventional current sensors.

BRIEF SUMMARY

Various embodiments described herein relate to current sensor components, apparatuses, and methods for self-calibration.

In accordance with various embodiments of the present disclosure, a self-calibrating current measuring apparatus is provided. In some embodiments, the component comprises a low-range current sensor configured to generate first voltage signals, a high-range current sensor configured to generate second voltage signals, and a self-calibration current measuring circuit configured to receive the first voltage signals and the second voltage signals, convert the first voltage signals and the second voltage signals into respective first digital signals and second digital signals, compare the first digital signals with the second digital signals, determine a difference between the first digital signals and the second digital signals exceed a recalibration threshold based on the comparison, generate calibration data based on the determination, and generate a digital output signal representative of a current reading based on an application of the calibration data to the second digital signals.

In some embodiments, the self-calibration current measuring apparatus further comprises a communication module configured to receive the digital output and transmit the digital output to a battery management system. In some embodiments, the low-range current sensor comprises a closed-loop current sensor or a fluxgate current sensor. In some embodiments, the high-range current sensor comprises an open-loop current sensor.

According to another embodiment, a method for evaluating current sensor performance is provided. In some embodiments, the method comprises receiving, by a computing device, a first current sensor signal and a second current sensor signal. In some embodiments, the method further comprises determining, by the computing device, a difference between the first current sensor signal and the second current sensor signal in association with a current reading value. In some embodiments, the method further comprises comparing, by the computing device, the difference with a recalibration threshold. In some embodiments, the method further comprises recalibrating, by the computing device, a current sensor based on a determination that the difference is greater than the recalibration threshold.

In some embodiments, recalibrating the current sensor further comprises generating calibration data based on the difference, and applying the calibration data to a measurement current sensor. In some embodiments, the current sensor is associated with the second current sensor signal. In some embodiments, the first current sensor signal comprises a digitized analog output voltage signal generated by a first current sensor. In some embodiments, the first current sensor comprises a low-range current sensor. In some embodiments, the second current sensor signal comprises a digitized analog output voltage signal generated by a second current sensor. In some embodiments, the second current sensor comprises a high-range current sensor. In some embodiments, the recalibration threshold comprises a constant threshold value for a range of current reading values. In some embodiments, the recalibration threshold comprises a plurality of threshold values for a range of current reading values. In some embodiments, the method further comprises comparing the difference with a recalibration threshold value associated with the current reading value.

According to another embodiment, a method for performing current sensor self-calibration is provided. In some embodiments, the method comprises receiving, by a computing device, first channel data and second channel data. In some embodiments, the method further comprises comparing, by the computing device, a difference between the first channel data and the second channel data with a recalibration threshold. In some embodiments, the method further comprises generating, by the computing device, new calibration data based on a determination that the difference is greater than the recalibration threshold. In some embodiments, the method further comprises applying, by the computing device, the new calibration data to the second channel data. In some embodiments, the method further comprises generating, by the computing device, a current reading based on the second channel data and the application of the new calibration data. In some embodiments, the method further comprising determining the first channel data and the second channel data are associated with a measurement of a current that is within a low range.

In some embodiments, the method further comprises determining the first channel data and the second channel data are not associated with a measurement of a current that is within a low range, determining the generation of the new calibration data, retrieving and applying current calibration data to the second channel data based on the determination of the generation of the new calibration data, and generating a current reading based on the second channel data and the application of the current calibration data. In some embodiments, the method further comprises determining the first channel data and the second channel data are not associated with a measurement of a current that is within a low range, retrieving and applying prior calibration data to the second channel data, and generating a current reading based on the second channel data and the application of the prior calibration data. In some embodiments, the method further comprises assigning the new calibration data as the current calibration data, and assigning calibration data generated prior to the new calibration data as prior calibration data. In some embodiments, the new calibration data comprises a linear transformation or a segmented mapping based on the first channel data or the difference.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION

Figure 1:
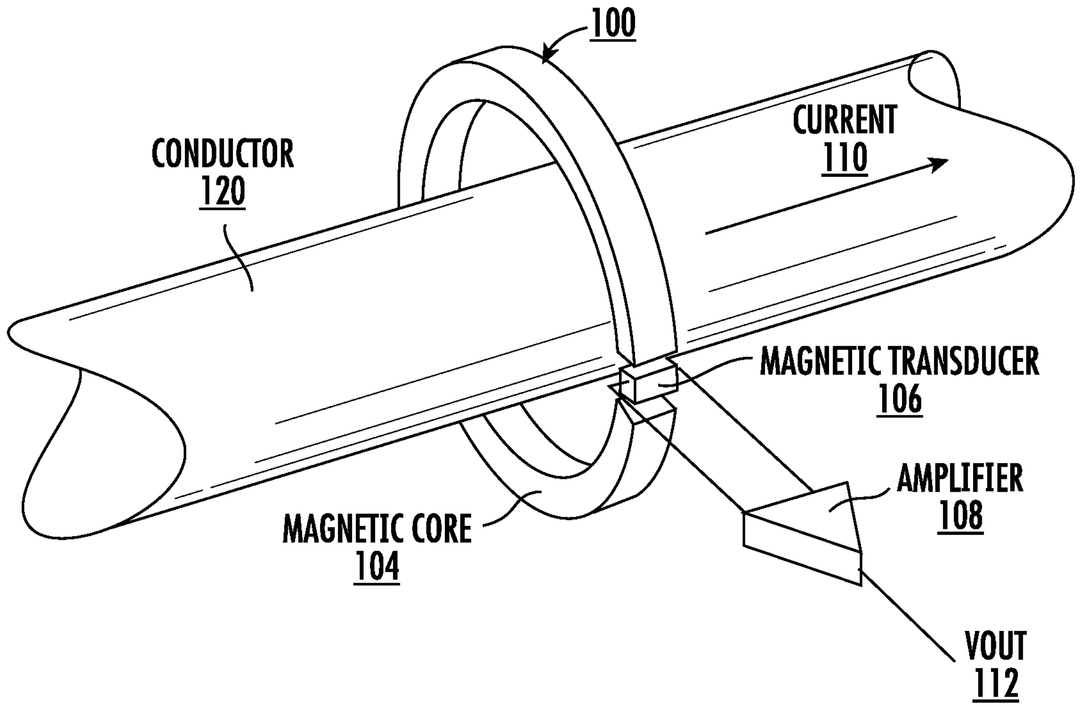
FIG. 1 illustrates a system architecture of an open-loop current sensor.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc., are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

Along with electronics and semiconductor devices, current sensors are widely used to measure operation current in power systems, such as in electrical vehicle battery systems. However, there are many technical challenges and difficulties associated with current sensors. Current sensors may comprise devices used to measure the flow of current in an electric circuit. Current sensors may comprise either open or closed-loop circuits used to measure current flowing through a conductor. Open-loop current sensors offer various advantages, such as low cost, low power consumption, and simple construction.

Referring now to FIG. 1, a system architecture of an open-loop current sensor 100 is provided, which may be used in accordance with various embodiments of the present disclosure. Open-loop current sensor 100 may be used for detection of a current through indirect sensing. As depicted in FIG. 1, the open-loop current sensor 100 comprises a magnetic core 104. The magnetic core 104 may comprise ferromagnetic materials, such as nanocrystalline and ferronickel materials.

The magnetic core 104 may comprise a ring-shaped object and an aperture comprising a void within an inner circumference of the magnetic core 104. The aperture may be configured for detection of a current through indirect sensing. For example, a conductor 120 carrying an electrical current may be placed through the aperture formed by magnetic core 104 of open-loop current sensor 100. The conductor 120 may comprise a busbar comprising a metallic bar or strip used to carry or transmit an electrical current.

Magnetic core 104 further comprises an air gap in which a magnetic transducer 106, such as a Hall-effect sensor is placed. The magnetic transducer 106 may generate an output voltage in response to magnetic flux caused by a current in the conductor 120 within the aperture formed by magnetic core 104. Electrical current carried by conductor 102 may produce a magnetic flux capable of inducing electromotive force (EMF), measured in voltage, according to Faraday's law of induction. The EMF may induce a current flow on the magnetic core 104. As such, the magnetic transducer 106 may output a Hall voltage proportionate to the magnetic core's current flow. Amplifier 108 may amplify voltages from magnetic transducer 106 to generate output voltage, Vout 112. Vout 112 may be taken directly from amplifier 108 to obtain voltage signals representative of current measurement.

Open-loop current sensors, such as the open-loop current sensor 100 depicted in FIG. 1, comprises an approach for detecting current on a conductor (e.g., conductor 120), with advantages, such as low cost, low power consumption and simple construction. However, the performance (e.g., linearity) of open-loop current sensor may be affected by magnetic hysteresis and environmental factors, such as humidity and temperature, causing zero drift and changes in magnetic transducer sensitivity. Accordingly, accuracy of open-loop current sensors may be difficult to achieve due to non-linearity caused by saturation effects and humidity/temperature.

Figure 2:
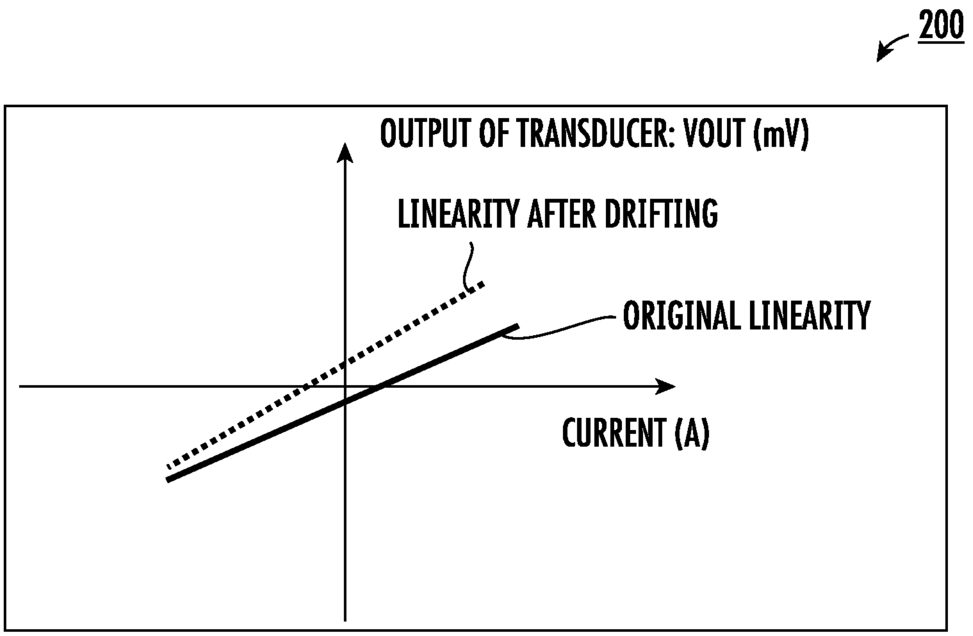
FIG. 2 illustrates a graph of example loss in performance of an open-loop current sensor exhibiting linearity drift.

FIG. 2 is a graph depicting example loss in performance of an open-loop current sensor exhibiting linearity drift. An open-loop current sensor with linearity drift prohibits obtainment of accurate measurements and may benefit from recalibration. However, another major drawback of open-loop current sensors is that recalibration may only be performed in a laboratory (e.g., by the manufacturer).

Other types of sensors, such as closed-loop current sensors may be used as an alternative to open-loop current sensors. For example, unlike an open-loop current sensor, a closed-loop current sensor is resistant to linearity drift in sensor sensitivity and offers higher measurement accuracy. A closed-loop current sensor may comprise components similar to an open-loop current sensor with the addition of a wire coil wrapped around the magnetic core. The wire coil may be driven by the detection voltage (e.g., Vout 112) of the conductor to feed an opposing current into the wire coil to create a flux balance that balances out the flux generated by the conductor current. Balancing in this way may eliminate the effects of temperature/humidity and saturation and allows for more accurate measurements. Fluxgate current sensors are also similar in operation to a closed-loop current sensor but may instead employ a saturable inductor using a small thin magnetic core to sense an air gap field, rather than a Hall-effect sensor. However, the added complexity of either closed-loop current sensors or fluxgate current sensors leads to higher cost. Thus, closed-loop current sensors and fluxgate current sensors are typically more accurate but higher in cost than open-loop current sensors.

Various example embodiments of the present disclosure overcome such technical challenges and difficulties in current sensors, and provide various technical advancements and improvements. In particular, a multi-sensor current measuring apparatus and a self-calibration method are disclosed herewith. A multi-sensor current measuring apparatus may comprise a plurality of current sensors with complementary capabilities such that advantages provided by each current sensor are utilized by the coexistence of the plurality of current sensors within a single apparatus. In some embodiments, a multi-sensor current measuring apparatus may comprise a calibration current sensor and a measurement current sensor. Measurements obtained by the measurement current sensor may be primarily provided as measured current readings and measurements obtained by the calibration current sensor may be provided as measured current readings as well as serving as a measurement reference to the measurement current sensor for determining accuracy of the measurement current sensor and whether calibration of the measurement current sensor is needed.

Figure 3:
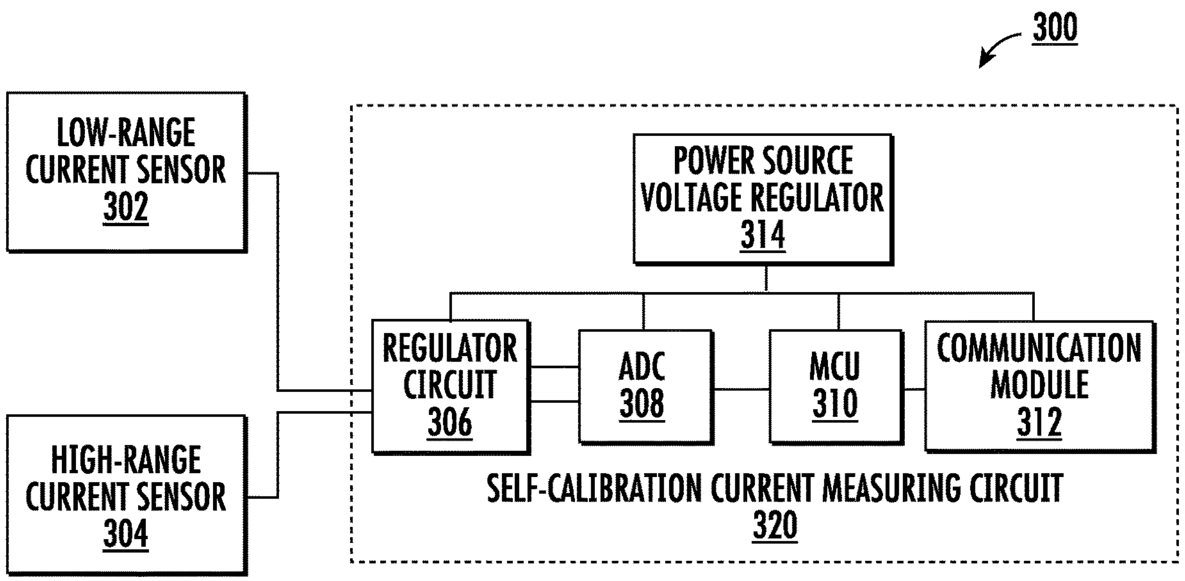
FIG. 3 illustrates an example schematic of a self-calibrating current measuring apparatus in accordance with some embodiments discussed herein.

FIG. 3 presents an example schematic of a self-calibrating current measuring apparatus according to various embodiments described herewith. The self-calibrating current measuring apparatus 300 comprises a low-range current sensor 302 and a high-range current sensor 304. That is, the self-calibrating current measuring apparatus 300 may simultaneously employ a combination of current sensors (e.g., with complementary capabilities) within a single apparatus. To prevent cross interference, the low-range current sensor 302 and the high-range current sensor 304 may be configured such that at least one magnetic transducer/inductor of the low-range current sensor 302 or the high-range current sensor 304 is separated, covered, or otherwise shielded.

In some embodiments, the low-range current sensor 302 may comprise a closed-loop current sensor or a fluxgate current sensor, and the high-range current sensor 304 may comprise an open-loop current sensor. As previously described, an open-loop current sensor (e.g., high-range current sensor 304) may be influenced by magnetic hysteresis and environmental factors, which affects measurement accuracy, while a closed-loop current sensor or a fluxgate current sensor (e.g., low-range current sensor 302) may be resistant to such influences and may be capable of providing relatively more stable and reliable current measurements. According to various embodiments of the present disclosure, the self-calibrating current measuring apparatus 300 may selectively employ the low-range current sensor 302 and the high-range current sensor 304 for certain functionalities based on their device capabilities. For example, the high-range current sensor 304 may be used to generate current readings due to its greater measurement range over the low-range current sensor 302, whereas the low-range current sensor 302, being able to measure current with a higher degree of accuracy than the high-range current sensor 304, may be used to provide reference measurements to calibrate current measurements of the high-range current sensor 304.

The low-range current sensor 302 may comprise a current sensor capable of measuring a first range of current with a first amount of accuracy. The high-range current sensor 304 may comprise a current sensor capable of measuring a second range of current with a second amount of accuracy. According to various embodiments of the present disclosure, the first range of current may be less than the second range of current and the first amount of accuracy may be more than the second amount of accuracy. As such, the low-range current sensor 302 may be capable of (i) measuring a range of current values that is smaller than the measurement range of the high-range current sensor 304, and (ii) measuring current with a higher degree of accuracy than the accuracy of the high-range current sensor 304. Conversely, the high-range current sensor 304 may be capable of (i) measuring a range of current values that is larger than the measurement range of the low-range current sensor 302, and (ii) measuring current with a lower degree of accuracy than the accuracy of the low-range current sensor 302.

In some embodiments, low-range current sensor 302 and high-range current sensor 304 may be concurrently used to measure current, provided that current being measured is within a measuring range of both the low-range current sensor 302 and the high-range current sensor 304. For example, low-range current sensor 302 may be capable of measuring current in a range of approximately 0-300 A while high-range current sensor 304 may be capable of measuring current in a range greater than (e.g., the upper limit, the lower limit, or both) the measurement range of the low-range current sensor 302, for example, approximately 50-600 A. Thus, according to the given example, low-range current sensor 302 and high-range current sensor 304 may be concurrently used to measure current for current values within the range of approximately 50-300 A. In some other embodiments, low-range current sensor 302 may be capable of measuring current in a range of approximately −300A to 300A, and the high-range current sensor 304 may be capable of measuring current in a range of approximately −1500A to 1500A.

The low-range current sensor 302 and the high-range current sensor 304 may comprise a measuring passthrough, aperture, or area of detection configured to receive, conduct, or sense a magnetic flux generated by a current carrying conductor (e.g., wire, cable, or bus). The induced magnetic flux may be detected by respective magnetic transducers of the low-range current sensor 302 and the high-range current sensor 304. The low-range current sensor 302 and the high-range current sensor 304 may generate analog output voltage signals based on the induced magnetic flux (e.g., proportional to the induced magnetic flux). The analog output voltage signals generated by low-range current sensor 302 and high-range current sensor 304 may be transmitted to a self-calibration current measuring circuit 320.

According to various embodiments of the present disclosure, self-calibration current measuring circuit 320 may use the analog output voltage signals from low-range current sensor 302 and high-range current sensor 304 to generate current readings and perform self-calibration. Current readings may be generated based on voltage signals from at least one of the low-range current sensor 302 or the high-range current sensor 304. In some embodiments, current readings may be based on voltage signals from the high-range current sensor 304, and voltage signals from the low-range current sensor 302 may be used as a reference for calibrating the high-range current sensor 304. For example, voltage signals from the low-range current sensor 302 may be compared with voltage signals from the high-range current sensor 304 to detect linearity drift of the high-range current sensor 304.

Self-calibration current measuring circuit 320 comprises regulator circuit 306, analog-to-digital converter (ADC) 308, microcontroller unit (MCU) 310, communication module 312, and power source voltage regulator 314. Low-range current sensor 302 and high-range current sensor 304 are coupled to regulator circuit 306 via channels. In some embodiments, a channel, as disclosed herewith, describes a physical transmission medium, such as a wire, cable, or link, and an interface dedicated to transferring signals from a specific source. Analog output voltage signals (e.g., Vout) from low-range current sensor 302 and high-range current sensor 304 may be transmitted to the regulator circuit 306 using respective channels. For example, a first channel may be designated to transmit analog output voltage signals from the low-range current sensor 302 to the regulator circuit 306 and a second channel may be designated to transmit analog output voltage signals from the high-range current sensor 304 to the regulator circuit 306. As such, the source of signals received by regulator circuit 306 are identifiable by the channel in which the signals are received.

Regulator circuit 306 may comprise electronic or circuit components configured to regulate analog voltages received from low-range current sensor 302 and high-range current sensor 304 to prevent overvoltage (e.g., voltages beyond the limits of self-calibration current measuring circuit 320). For example, the regulator circuit 306 may protect the self-calibration current measuring circuit 320 from overvoltage by supplying a regulated voltage when a voltage received from either low-range current sensor 302, or high-range current sensor 304 exceeds a threshold voltage. Regulator circuit 306 may pass through regulated analog voltages associated with the low-range current sensor 302 and high-range current sensor 304 to analog-to-digital converter (ADC) 308.

ADC 308 may comprise one or more circuit or electronic components configured to convert an analog voltage to a digital number representing the magnitude of the analog voltage. For example, ADC 308 may convert a continuous-time and continuous-amplitude analog signal to a discrete-time and discrete-amplitude digital signal. According to various embodiments of the present disclosure, the self-calibration current measuring circuit 320 may use the ADC 308 to convert the regulated analog output voltage signals associated with the low-range current sensor 302 and high-range current sensor 304 into respective digital signals for processing by microcontroller unit (MCU) 310. For example, MCU 310 may process a first digital input signal representative of the analog output voltage signal associated with the low-range current sensor 302 and a second digital input signal representative of the analog output voltage signal associated with the high-range current sensor 304 to generate a digital output signal comprising a current reading. The current reading may be an estimated current of a current carrying conductor which may be calculated based on a conversion of digital input signals associated with at least one of the low-range current sensor 302 or the high-range current sensor 304. In some embodiments, the digital output signal may be generated using only digital input signals of the high-range current sensor 304, for example, if a current being measured is outside the measuring range of the low-range current sensor 302.

The MCU 310 may further compare the first digital input signal representative of analog output voltage signals associated with the low-range current sensor 302 with the second digital input signal representative of analog output voltage signals associated with the high-range current sensor 304 to determine whether calibration of the high-range current sensor 304 is needed. For example, the MCU 310 may monitor differences between the first digital input signal representative of the analog output voltage signal associated with the low-range current sensor 302 and the second digital input signal representative of the analog output voltage signal associated with the high-range current sensor 304 and determine when a monitored difference exceeds a recalibration threshold. In some embodiments, if the differences do not exceed the recalibration threshold, a digital output signal comprising a current reading is generated based on at least one of the first digital input signal or the second digital input signal. In some additional embodiments, if the differences exceed the recalibration threshold, a self-recalibration method is performed to generate calibration data, which is described in further detail with respect to the description of FIG. 7. Calibration data, as disclosed herewith, may describe a transformation function or mapping used to align data from a measurement current sensor with data from a calibration current sensor. In some embodiments, the calibration data may be applied to, for example, the second digital input signal, for generating a digital output signal that reflects a measurement by the high-range current sensor 304 calibrated based on the first digital input signal associated with the low-range current sensor 302.

MCU 310 may comprise a processing element embodied as one or more complex programmable logic devices (CPLDs), microprocessors, multi-core processors, coprocessing entities, application-specific instruction-set processors (ASIPs), microcontrollers, and/or controllers. Further, the MCU 310 may be embodied as one or more other processing devices or circuitry. The term circuitry may refer to an entirely hardware embodiment or a combination of hardware and computer program products. Thus, the MCU 310 may be embodied as integrated circuits, application specific integrated circuits (ASICs), field programmable gate arrays (FPGAs), programmable logic arrays (PLAs), hardware accelerators, other circuitry, and/or the like.

As will therefore be understood, the MCU 310 may be configured for a particular use or configured to execute instructions stored in volatile or non-volatile media or otherwise accessible to the MCU 310. As such, whether configured by hardware or computer program products, or by a combination thereof, the MCU 310 may be capable of performing steps or operations according to embodiments of the present disclosure when configured accordingly.

Digital output signals generated by the MCU 310 may be received by communication module 312 for communication of the digital output signals to various computing entities, such as by communicating data comprising the digital output signals, e.g., representative of a measured current of a current carrying conductor, that can be transmitted, received, operated on, processed, displayed, stored, and/or the like. In some embodiments, the communication module 312 may comprise a controller area network (CAN) transceiver configured to communicate with one or more components within a vehicle, such as a battery management system. In some other embodiments, communication module 312 may transmit and receive data, in accordance with air interface standards of applicable wireless systems. In this regard, the self-calibrating current measuring apparatus 300 may be capable of operating with one or more air interface standards, communication protocols, modulation types, and access types. More particularly, the self-calibrating current measuring apparatus 300 may operate in accordance with any of a number of wireless communication standards and protocols, such as those described above with regard to the predictive data analysis computing entity 106. In some embodiments, the self-calibrating current measuring apparatus 300 may operate in accordance with multiple wireless communication standards and protocols, such as UMTS, CDMA2000, 1×RTT, WCDMA, GSM, EDGE, TD-SCDMA, LTE, E-UTRAN, EVDO, HSPA, HSDPA, Wi-Fi, Wi-Fi Direct, WiMAX, UWB, IR, NFC, Bluetooth, USB, and/or the like. Similarly, in some alternative embodiments, the self-calibrating current measuring apparatus 300 may operate in accordance with multiple wired communication standards and protocols, such as fiber distributed data interface (FDDI), digital subscriber line (DSL), Ethernet, asynchronous transfer mode (ATM), frame relay, data over cable service interface specification (DOCSIS), or any other wired transmission protocol.

Power source voltage regulator 314 may comprise one or more circuit or electronic components configured to provide relatively steady supply voltage(s) to components of self-calibration current measuring circuit 320 (regulator circuit 306, ADC 308, MCU 310, and communication module 312). For example, the power source voltage regulator 314 may convert a supply voltage from a direct current (DC) power supply to one or more constant voltages used by components of the self-calibration current measuring circuit 320 where one or more of the components may have voltage level requirements different from that supplied by the DC power supply. In some embodiments, the power source voltage regulator 314 may comprise a DC-to-DC converter or a low-dropout regulator (LDO).

Figure 4:
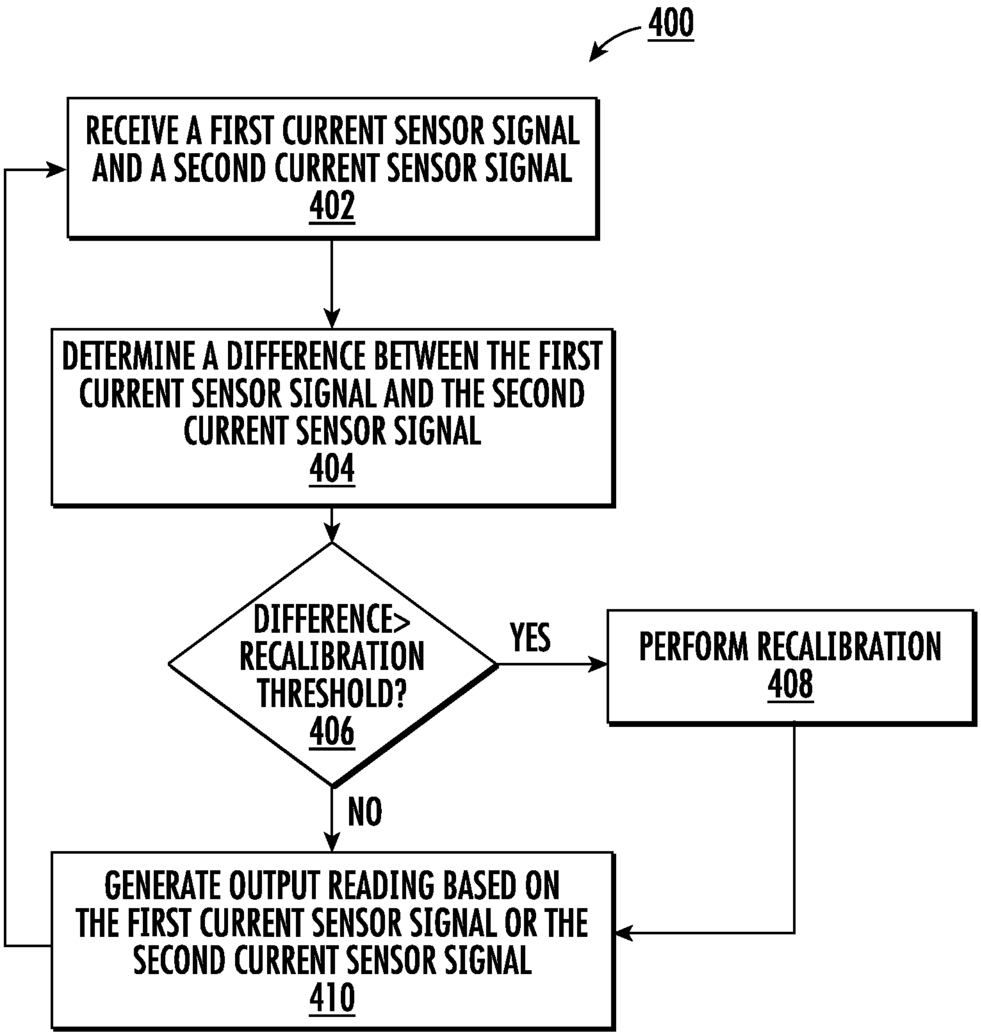
FIG. 4 illustrates an example flow diagram of a method for evaluating current sensor performance in accordance with some embodiments discussed herein.

Referring now to FIG. 4, an example flow diagram illustrating an exemplary method for evaluating current sensor performance in accordance with some example embodiments of the present disclosure. It is noted that each block of a flowchart, and combinations of blocks in the flowchart, may be implemented by various means such as hardware, firmware, circuitry, and/or other devices associated with execution of software including one or more computer program instructions. For example, one or more of the steps/operations described in FIG. 4 may be embodied by computer program instructions, which may be stored by a non-transitory memory of an apparatus employing an embodiment of the present disclosure and executed by a processor component in an apparatus (such as, but not limited to, MCU 310). For example, these computer program instructions may direct the processor component to function in a particular manner, such that the instructions stored in the computer-readable storage memory produce an article of manufacture, the execution of which implements the function specified in the flowchart block(s).

In FIG. 4, the example method 400 may be executed by a computing device associated with a self-calibrating current measuring apparatus (for example, as illustrated and described above in connection with at least FIG. 3). At step 402, a first current sensor signal and a second current sensor signal are received. The first current sensor signal may comprise a digitized analog output voltage signal generated by a first current sensor (e.g., low-range current sensor 302). The second current sensor signal may comprise a digitized analog output voltage signal generated by a second current sensor (e.g., high-range current sensor 304). The analog output voltage signals generated by the first current sensor and the second current sensor may be based on measurements of magnetic flux, e.g., from a current carrying conductor, representative of (or proportional to) current amplitude of the current carrying conduct. As such, the first current signal and the second current signal comprise current amplitude readings measured by the first current sensor and the second current sensor, respectively.

In some embodiments, subsequent to step 402, the example method proceeds to step 404, where a difference between the first current sensor signal and the second current sensor signal is determined in association with a current reading value. The difference may be used to determine current sensor drift. For example, the first current sensor signal may be used as a base reference that is compared with the second current sensor signal.

Figure 5:
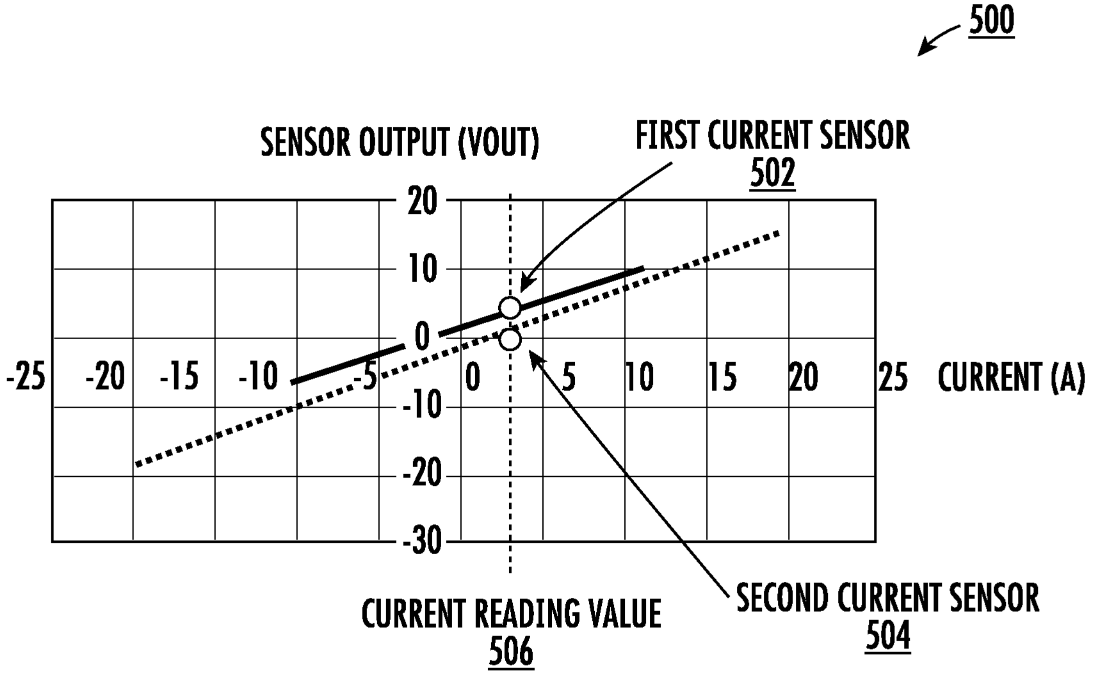
FIG. 5 illustrates a graph of example linearity associated with a first current sensor signal and a second current sensor signal in accordance with various embodiments described herewith.

FIG. 5 presents an example graph of linearity associated with a first current sensor signal and a second current sensor signal in accordance with various embodiments described herewith. As depicted in FIG. 5, sensor outputs of first current sensor 502 differ in various degrees with respect to sensor outputs of second current sensor 504 over a range of current measurements. The difference in sensor outputs may be attributed to a difference in measurement accuracy or precision between first current sensor 502 and second current sensor 504. Moreover, the difference in sensor outputs may result from linearity drift of at least one of the first current sensor 502 or the second current sensor 504. According to the illustrated example, the first current sensor 502 may comprise a calibration current sensor (e.g., a closed-loop current sensor or a fluxgate current sensor, such as low-range current sensor 302) and the second current sensor 504 may comprise a measurement current sensor (e.g., an open-loop current sensor, such as high-range current sensor 304). As such, sensor output of the first current sensor 502 may be used as a baseline reference to determine when to compensate for linearity drift of sensor output from the second current sensor 504. A difference in the sensor outputs for current reading value 506 may be determined and compared with a recalibration threshold.

Referring back to FIG. 4, in some embodiments, subsequent to step 404, the example method proceeds to step 406, where the difference is compared with a recalibration threshold. The recalibration threshold may comprise a value representative of a maximum allowable difference between the first current sensor signal and the second current sensor signal for a given current reading value without having to perform a recalibration. The recalibration threshold may comprise either a constant threshold value or a plurality of variable threshold values across a range of current reading values. As such, comparing the difference may comprise comparing the difference with a recalibration threshold value associated with the current reading value.

Figure 6A:
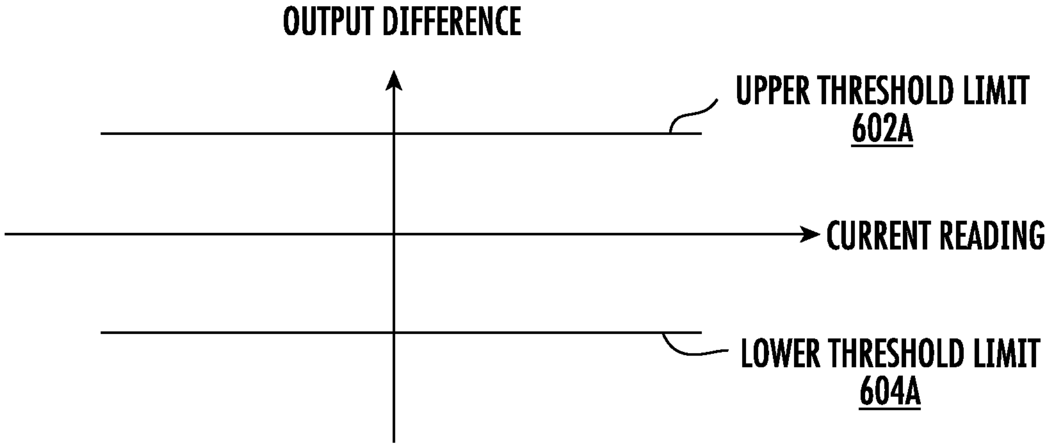
FIG. 6A and FIG. 6B illustrate example recalibration thresholds in accordance with various embodiments described herewith.
Figure 6B:
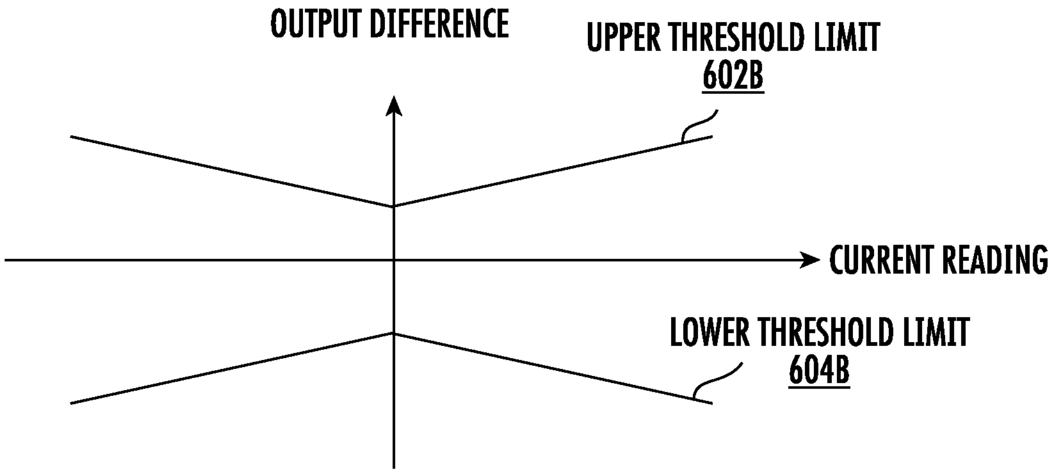

FIG. 6A and FIG. 6B present example recalibration thresholds in accordance with various embodiments described herewith. An example recalibration threshold comprising a constant upper threshold limit 602A and a constant lower threshold limit 604A across a range of current reading values is depicted in FIG. 6A. Another example recalibration threshold comprising an increasing upper threshold limit 602B (in proportion to absolute magnitude current reading values) and decreasing lower threshold limit 604B (in proportion to absolute magnitude current reading values) is depicted in FIG. 6B.

Referring back to FIG. 4, in some embodiments, subsequent to step 406, if the difference is greater than the recalibration threshold, the example method proceeds to step 408, where a recalibration of a current sensor is performed. Recalibration of a current sensor may comprise generating calibration data based on the difference and applying the calibration data to a measurement current sensor. In an example embodiment, the recalibration is performed on a sensor associated with the second current sensor signal (e.g., a high-range current sensor 304). Recalibration of a current sensor is described in further detail with reference to the description of FIG. 7.

In some embodiments, subsequent to step 408, the example method proceeds to step 410, where an output reading is generated based on (i) the first current sensor signal or (ii) the second current sensor signal applied with calibration data.

In some embodiments, subsequent to step 406, if the difference is not greater than the recalibration threshold, the example method directly proceeds to step 410, where an output reading is generated based on the first current sensor signal or the second current sensor signal, without the application of calibration data.

Figure 7:
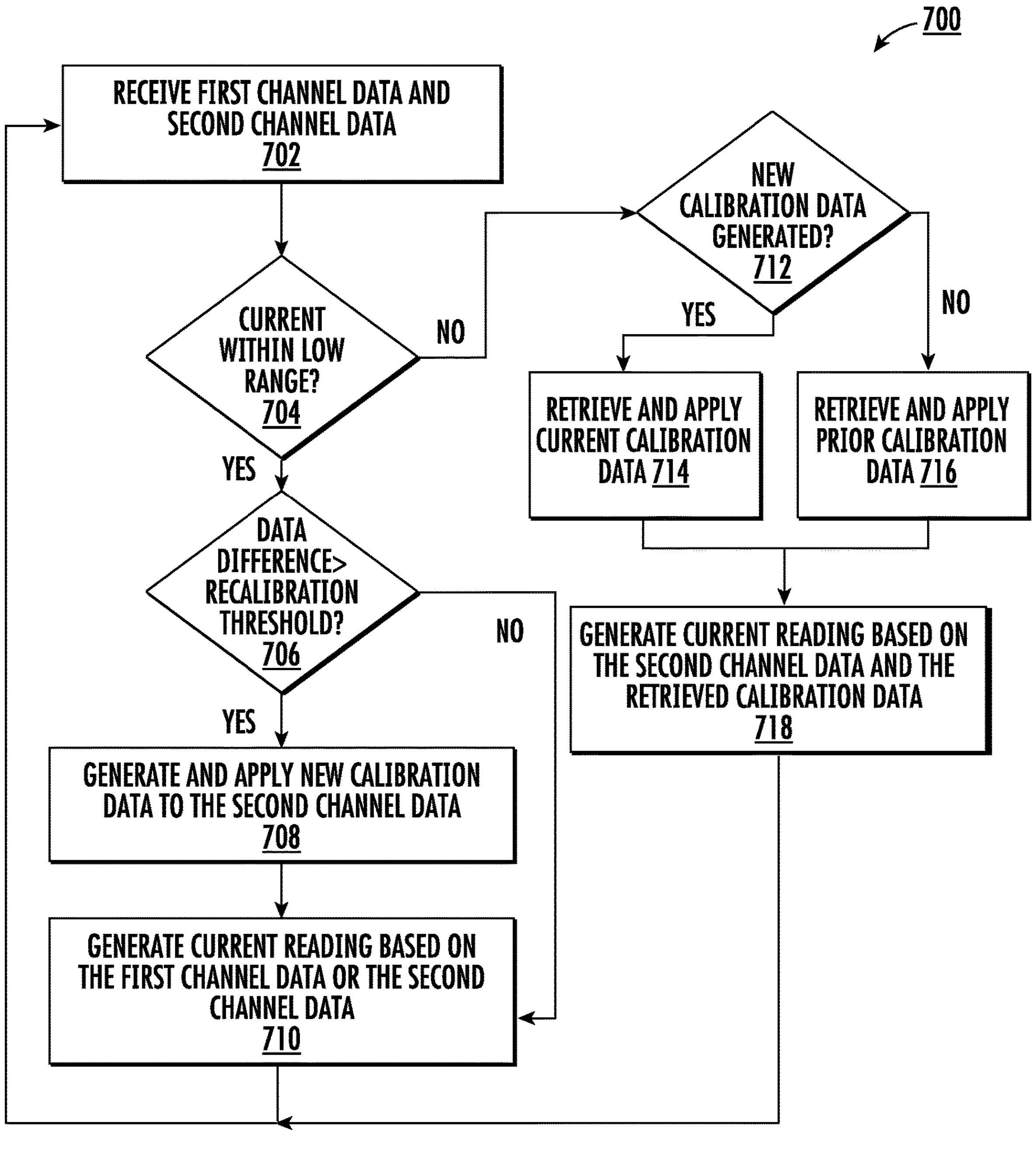
FIG. 7 illustrates a flowchart of a method for performing current sensor self-calibration in accordance with some embodiments discussed herein.

Referring now to FIG. 7, an example flow diagram illustrating an exemplary method for performing current sensor self-calibration in accordance with some example embodiments of the present disclosure. It is noted that each block of a flowchart, and combinations of blocks in the flowchart, may be implemented by various means such as hardware, firmware, circuitry, and/or other devices associated with execution of software including one or more computer program instructions. For example, one or more of the steps/operations described in FIG. 7 may be embodied by computer program instructions, which may be stored by a non-transitory memory of an apparatus employing an embodiment of the present disclosure and executed by a processor component in an apparatus (such as, but not limited to, MCU 310). For example, these computer program instructions may direct the processor component to function in a particular manner, such that the instructions stored in the computer-readable storage memory produce an article of manufacture, the execution of which implements the function specified in the flowchart block(s).

In FIG. 7, the example method 700 may be executed by a computing device associated with a self-calibrating current measuring apparatus (for example, as illustrated and described above in connection with at least FIG. 3). At step 702, first channel data and second channel data are received. The first channel data may comprise a sampling of digital input signals (e.g., over a sampling period) from a channel associated with a first current sensor (e.g., low-range current sensor 302). The second channel data may comprise a sampling (e.g., over the same sampling period as the sampling associated with the first channel data) of digital input signals from a channel associated with a second current sensor (e.g., high-range current sensor 304). The first channel data and the second channel data may be representative of current (e.g., voltage based on magnetic flux) measured by the first current sensor and the second current sensor, respectively. In some embodiments, the first channel data and the second current sensor comprise digital voltage signals associated with current amplitude readings measured by the first current sensor and the second current sensor, respectively. In some embodiments, a low-range current sensor may be associated with the first channel data and a high-range current sensor may be associated with the second channel data.

In some embodiments, subsequent to step 702, the example method proceeds to step 704, where a determination is made whether the first channel data and the second channel data are associated with a measurement of a current that is within a low range. For example, the low range may be representative of a measuring range of a low-range current sensor. That is, step 704 determines that a current being measured is a value that is measurable by a low-range current sensor (e.g., low-range current sensor 302) such that a comparison between the first channel data and the second channel data may be accurately made to perform a calibration on a high-range current sensor (e.g., high-range current sensor 304).

In some embodiments, subsequent to step 704, if the current measurement is within the low range, the example method proceeds to step 706, where a difference between the first channel data and the second channel data is determined and compared with a recalibration threshold. The recalibration threshold may comprise a value representative of a maximum allowable difference between the first channel data and the second channel data without having to perform a recalibration. According to various embodiments of the present disclosure, the recalibration threshold may comprise a constant threshold value for all current values or a variable value across different current reading values, as previously described.

In some embodiments, subsequent to step 706, if the difference between the first channel data and the second channel data is greater than the recalibration threshold, the example method proceeds to step 708, where new calibration data is generated and applied to the second channel data. The new calibration data may comprise a transformation function or mapping that is applied to the second channel data based on the first channel data. For example, a linear transformation or segmented mapping, with respect to the first channel data or the difference, may be performed on to the second channel data by applying calibration data to the second channel data. As such, current measuring capability of the first channel data may be more accurate and reliable than the second channel data allowing for the first channel data to be used as a basis for correction of the second channel data.

Figure 8A:
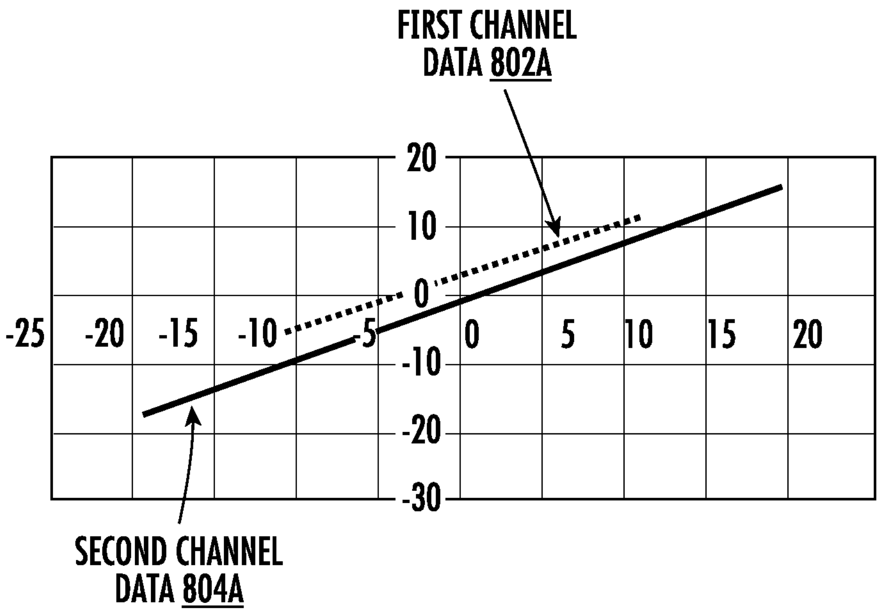
FIG. 8A illustrates a graph of example linearity associated with a first channel data and a second channel data in accordance with some embodiments discussed herein.
Figure 8B:
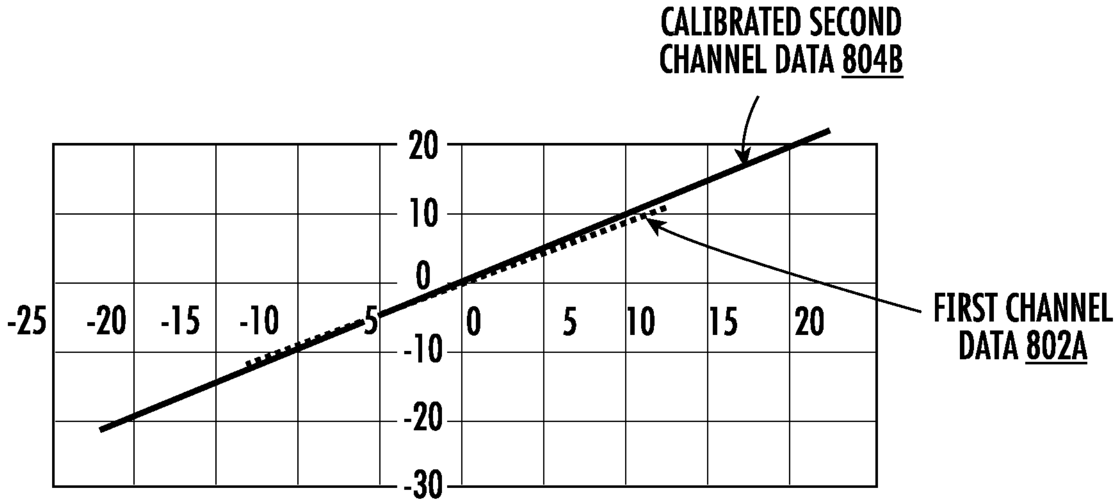
FIG. 8B illustrates a graph of example linearity associated with a first channel data and a calibrated second channel data in accordance with some embodiments discussed herein.

According to various embodiments of the present disclosure, the new calibration data may be used to skew the second channel data based on a difference between the first channel data and the second channel data. FIG. 8A depicts example linearity associated with first channel data and second channel data. As depicted, first channel data 802A and second channel data 804A exhibit different linearity characteristics. However, by applying new calibration data to the second channel data 804A, calibrated second channel data 804B may be generated that aligns with the first channel data 802A, as depicted in FIG. 8B. For every instance new calibration data is generated, the new calibration data may be assigned as current calibration data and calibration data generated prior to the new calibration data (e.g., previously assigned as current calibration data or original calibration data) may be assigned as prior calibration data.

Referring back to FIG. 7, in some embodiments, subsequent to step 708, the example method proceeds to step 710, where a current reading is generated based on the first channel data or the second channel data applied with the new calibration data.

In some embodiments, subsequent to step 706 if the difference between the first channel data and the second channel data is not greater than the recalibration threshold, the example method proceeds to step 710, where a current reading is generated based on the first channel data or the second channel data, without the application of calibration data.

In some embodiments, subsequent to step 710, the example method proceeds to step 702, where another set of first channel data and second channel data is received.

In some embodiments, subsequent to step 704, if the current measurement is not within the low range, the example method proceeds to step 712, where a determination is made whether new calibration data was generated.

In some embodiments, subsequent to step 712, if new calibration data was generated, the example method proceeds to step 714, where current calibration data is retrieved and applied. Otherwise, in some embodiments, subsequent to step 712, if new calibration data was not generated, the example method proceeds to step 716, where prior calibration data is retrieved and applied. For example, the retrieved current calibration data or prior calibration data may be applied to the second channel data (associated with the second current sensor, such as high-range current sensor 304). Current calibration data may refer to the new calibration data and prior calibration data may refer to calibration data generated prior to the new calibration data.

In some embodiments, subsequent to steps 714 or 716, the example method proceeds to step 718, where a current reading is generated based on the second channel data and the application of the retrieved calibration data (either current calibration data from step 714, or prior calibration data from step 716). That is, the retrieved calibration data may be applied to the second channel data to generate the current reading.

In some embodiments, subsequent to step 718, the example method proceeds to step 702, where another set of first channel data and second channel data is received.

It is to be understood that the disclosure is not to be limited to the specific embodiments disclosed, and that modifications and other embodiments are intended to be included within the scope of the appended claims. Although specific terms are employed herein, they are used in a generic and descriptive sense only and not for purposes of limitation, unless described otherwise.

The invention claimed is:

1. A self-calibrating current measuring apparatus comprising:

a low-range current sensor configured to generate a first set of one or more voltage signals, wherein the low-range current sensor comprises a closed-loop current sensor or a fluxgate current sensor;

a high-range current sensor configured to generate a second set of one or more voltage signals, wherein the high-range current sensor comprises an open-loop current sensor; and a self-calibration current measuring circuit configured to:

receive the first set of one or more voltage signals and the second set of one or more voltage signals, convert the first set of one or more voltage signals into a first set of one or more digital signals, convert the second set of one or more voltage signals into a second set of one or more digital signals, determine a difference between the first set of one or more digital signals and the second set of one or more digital signals exceed a recalibration threshold based on a comparison of the first set of one or more digital signals with the second set of one or more digital signals, generate calibration data based on the difference, and generate a digital output signal representative of a current reading based on an application of the calibration data to the second set of one or more digital signals.

2. The self-calibrating current measuring apparatus of claim 1, further comprising a communication module configured to receive the digital output signal and transmit the digital output signal to a battery management system.

* * * * *